United States Patent [19]

Moriyama

[11] Patent Number: 4,575,942
[45] Date of Patent: Mar. 18, 1986

[54] ULTRA-PRECISION TWO-DIMENSIONAL MOVING APPARATUS

[75] Inventor: Shigeo Moriyama, Hachioji, Japan

[73] Assignee: Hitachi, Ltd., Tokyo, Japan

[21] Appl. No.: 542,991

[22] Filed: Oct. 18, 1983

[30] Foreign Application Priority Data

Oct. 18, 1982 [JP] Japan ............................ 57-181338

[51] Int. Cl.⁴ ............................................. G01B 5/25
[52] U.S. Cl. ..................................... 33/1 M; 33/568
[58] Field of Search ................. 33/1 M, 23 C, 19 A, 33/174 TA, 180 R, 573, 568; 356/153; 355/53; 350/531

[56] References Cited

U.S. PATENT DOCUMENTS 3,617,126 11/1971 Gillespie ........................ 33/1 M X
3,744,902 7/1973 Henker ...................... 33/174 TA X
4,118,869 10/1978 Hartung et al. ................. 33/1 M X Primary Examiner—Harry N. Haroian
Attorney, Agent, or Firm—Antonelli, Terry & Wands

[57] ABSTRACT

An ultra-precision two-dimensional moving apparatus is disclosed, in which a fine-moving table is two-dimensionally movably held on a coarse-moving carriage. This fine-moving table is driven finely in X, Y and θ directions by three piezoelectric element actuators. The fine-table position is measured by a laser interferometric measurement system. In response to the error signal between the measured position and a desired position, the piezoelectric element actuators are driven by closed loop control.

15 Claims, 3 Drawing Figures

ULTRA-PRECISION TWO-DIMENSIONAL MOVING APPARATUS

BACKGROUND OF THE INVENTION

1. Field of the Invention

The present invention relates to an ultra-precision two-dimensional moving apparatus, or more in particular to an ultra-precision two-dimensional moving apparatus suitable for use as a work table for a reduction projection exposure apparatus or an electron-beam exposure system.

2. Description of the Prior Art

The ultra-precision X-Y moving table used for the conventional systems mentioned above requires a positioning accuracy as high as 0.1 $\mu$m on the one hand and a high-speed positioning function on the other hand, and it is common practice to use a composite-type moving mechanism including a combination a high-speed X-Y coarse-stage and an X-Y fine-stage.

The conventional composite-type moving mechanism is of a four-stage structure comprising a Y coarse-table moved along a Y axis on an X coarse-table moved along an X axis, and an X fine-table and a Y fine-table mounted on the Y coarse-table. This construction is complicated and high in cost, and also with an increased weight of the moving parts, adversely affects the high-speed positioning.

SUMMARY OF THE INVENTION

An object of the present invention is to provide an ultra-precision two-dimensional moving apparatus of composite type which is simple in construction.

Another object of the present invention is to provide an ultra-precision two-dimensional moving apparatus which permits an accurate specification of the distance covered or coverage.

According to the present invention, there is provided an ultra-precision two-dimensional moving apparatus in which, instead of the conventional fine-table mechanism in two X and Y stages, a single fine table is held with elastic posts on the coarse-table and is driven by at least three linear-actuators.

DESCRIPTION OF THE PREFERRED EMBODIMENT

Figure 1:
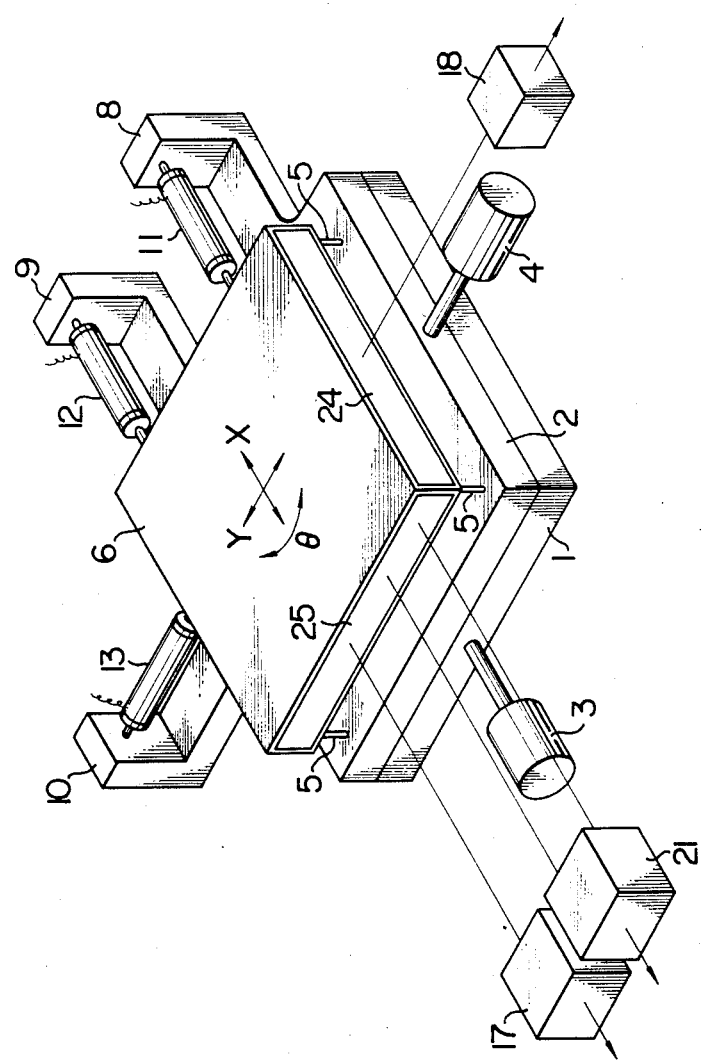
FIG. 1 is a perspective view showing an embodiment of the present invention.
Figure 2:
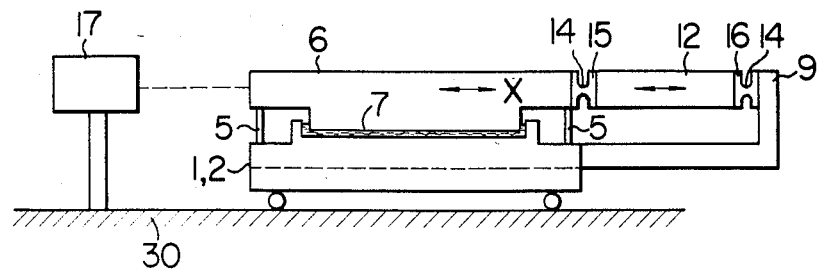
FIG. 2 is a sectional view taken along X-axis of the essential parts of FIG. 1.
Figure 3:
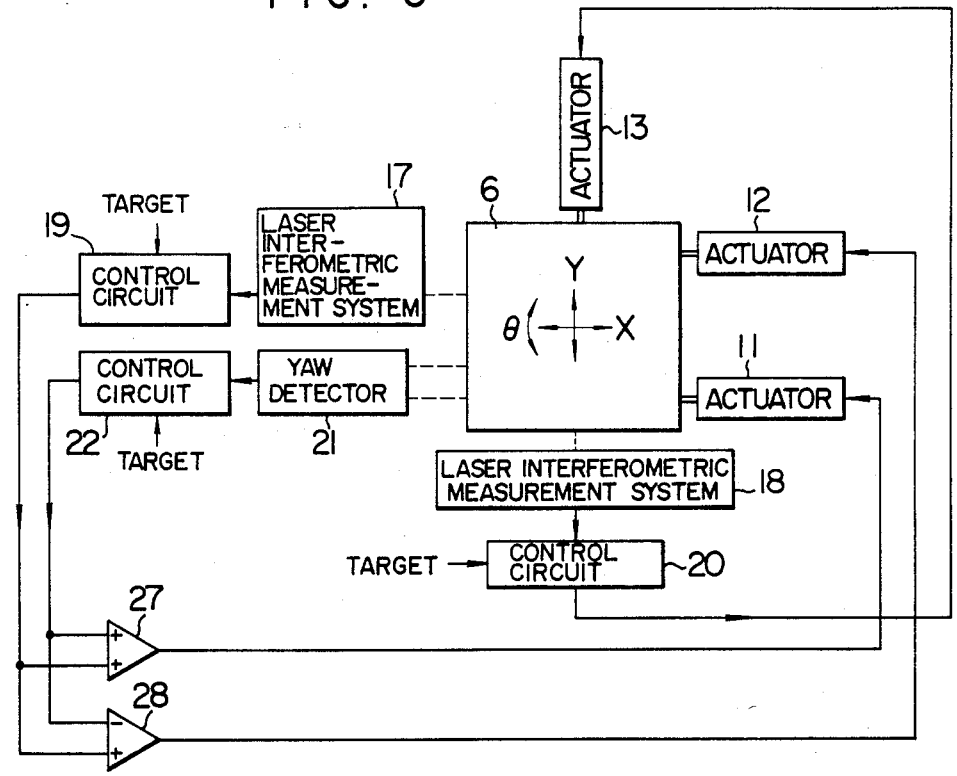
FIG. 3 is a diagram showing a construction of the control system of the embodiment shown in FIG. 1.

The construction of an embodiment of the present invention will be explained below with reference to FIGS. 1 to 3. In the drawings, the same or equivalent parts are designated by the same reference numerals respectively.

An X-Y coarse-stage includes an X coarse-table 1, a Y coarse-table 2 and driving mechanisms 3 and 4 for respective tables. The Y coarse-table 2 is two-dimensionally positioned with the accuracy of about ±5 $\mu$m for the moving range of about 150 mm square along X and Y directions. This technique is well known as disclosed in U.S. Pat. No. 3,886,421. A fine-table 6 with the four corners thereof supported by elastic posts 5 made of steel and the like is mounted on the Y coarse-table 2.

The fine-table 6 is freely movable in a fine manner along X, Y or $\theta$ direction approximately to ±50 $\mu$m which is the elastic deformable range of the elastic posts 5. A gap of about 100 $\mu$m is provided between the Y coarse-table 2 and the fine table 6 by adjusting the length of the elastic posts 5 and this gap is filled with a high-viscosity oil such as silicon oil 7. The layer of the oil 7, which functions as damper, absorbs the fine vibration of the fine-table 6.

The Y coarse-table 2 has L-shaped support frames 8, 9 and 10 secured thereto at two points along X axis and one point along Y axis. Piezoelectric actuators 11, 12 and 13 are fixedly inserted between the L-shaped support frames 8, 9, 10 and the fine-table 6. The piezoelectric actuators 11, 12 and 13 utilize the small expansion or contraction of the elements caused by the electrostrictive effect of the piezoelectric elements, so that according to the present embodiment, the displacement of the fine table of about 20 $\mu$m is obtained in response to the applied voltage of DC 600 V as compared with when no voltage is applied.

The feature of this invention lies in that the use of the above-mentioned three piezoelectric actuators makes it possible to finely displace the fine-table 6 along X and Y directions on the one hand and to control the fine angular displacement (hereinafter referred to as yaw) thereof on the other hand. This feature eliminates the X-Y guide mechanism using a parallel leaf spring unit for the fine-table which is indispensable for the conventional apparatuses, thereby reducing the size of the apparatus considerably.

With the fine movement of the fine-table 6 along X and Y directions, the piezoelectric actuators are tilted slightly in the X-Y plane. This displacement is compensated for by the elastic deformation of the circular notch 14 of the output terminals 15, 16 provided at the ends of each of the three piezoelectric actuators. Numerals 17 and 18 designate a laser interferometric measurement system for detecting the X and Y positions of the fine-table 6 with the accuracy of about 0.02 $\mu$m. Such a laser interferometric measurement system is available on the market. This measuring system is fixed on a base 30, and with a laser beam applied to the reflectors 24, 25 on the sides of the fine-table 6, detects the distance of travel of the fine-table 6 by receiving the reflected light. Numerals 19 and 20 designate control circuits, each of which compares a target value given from an external computer or an operator with a measured value with the laser interferometric measurement system and regulates the control voltage on the basis of the difference or error signal therebetween. Control voltages of equal variation are applied from the control circuit 19 through adders 27 and 28 to the piezoelectric actuators 11 and 12 respectively, thereby to slide the fine-table 6 along X axis without yaw occurrence. The control voltage from the control circuit 20, on the other hand, is applied to the piezoelectric actuator 13 thereby to slide the fine table 6 along Y axis. Thus, the fine-table 6, the laser interferometric measurement system 17, the control circuit 19 and the piezoelectric actuators 11, 12 form one closed loop control system with respect to the X axis, on the one hand, and the fine table 6, the laser interferometric measurement system 18, the control circuit 20 and the piezoelectric actuator 13 form another closed loop control system with respect to the Y axis, so that the fine-table 6 is positioned to the desired target thereby. Numeral 21 designates a laser interferometric measurement system for yaw detection based on the distance error measured by use of parallel two laser beams. The control circuit 22 generates a control voltage in response to the difference between the measured value from the laser interferometric measurement system 21 and the target value given from an external source. This control voltage is applied in reverse phases to the adders 27 and 28 thereby to cause the piezoelectric actators 11 and 12 to drive the fine-table 6 in reverse directions, thus rotating the fine-table 6. As a result, a closed loop control system is formed of the fine-moving table 6, the laser interferometric measurement system 21 for yaw, the control circuit 22 and the piezoelectric actuators 11, 12.

As explained above, by changing the targets of the control circuits 19, 20 and 22, the applied voltages of the piezoelectric actuators 11, 12 and 13 may be changed respectively, so that the positional relations of the fine-table 6 to the Y-coarse table 2 along X, Y and $\theta$ directions may be changed while at the same limiting the positional relations as long as the applied voltage remains unchanged.

A method of controlling the above-mentioned X-Y fine-stage will be described. In FIG. 1, the position of the fine-table 6 along X and Y axes in the stationary coordinate system is accurately detected with the accuracy of about 0.02 $\mu$m by the laser interferometric measurement systems 17 and 18 respectively. First, targets are set in the control circuits 19, 20 and 22. After the fine-table 6 is positioned to the target within the accuracy of $\pm 5$ $\mu$m by the X-Y coarse-stage, the accurate coordinate of the fine-table 6 is detected by the laser interferometric measurement systems 17 and 18. In this case, the piezoelectric actuators 11, 12 and 13 are supplied by the closed loop control system with such a voltage that the difference between the detection signal and the target is zero for automatic control.

In this method of control, a pair of piezoelectric actuators 11 and 12 are provided along X axis. So that, generally, the fine-table 6 may be driven only in X direction without any small $\theta$ angular motion or yaw by applying the same control signal to the piezoelectric actuators. In the case where the apparatus is used as an X-Y work table for the reduction projection exposure apparatus, however, even a slight yaw with the fine-table 6 is not permitted. Within the moving range of about 150 mm square, for example, the value of yaw of $\pm 5 \times 10^{-6}$ rad or less is required. According to a method suggested in the past for detecting and correcting the yaw with the fine-table, a table is provided which rotates around a fulcrum. According to the present invention, as shown in FIG. 3, on the other hand, the value of yaw with the fine-table 6 is detected by use of the yaw-detecting laser interferometric measurement system 21, and in any case of yaw occurrence, the two piezoelectric actuators 11 and 12 for X direction are supplied with voltages of reverse phases so that the fine-table 6 is angularly displaced for correction of the value yaw. In this case, the target value of the control circuit 22 is fixed. Although the description made above concerns the case using piezoelectric element, magnetostrictive elements or electromagnetic actuators may alternatively be used with equal effect.

It will be understood from the foregoing description that according to the present invention, the value yaw caused by the X-Y coarse-stage may be easily corrected by the fine-table and therefore a very high guidance accuracy is not required for the X-Y coarse-stage, thereby making it possible to fabricate the apparatus with low cost.

Further, instead of continuous detection and correction of the value yaw with a yaw-detecting laser interferometric measurement system, a map of value yaw may be prepared by prior measurement in the X-Y coordinate of the X-Y coarse-stage and on the basis of this data, the fine-table may be rotated to correct the value yaw with the X-Y coarse-stage.

I claim:

1. An ultra-precision two-dimensional moving apparatus comprising:
    a coarse-moving carriage movable two-dimensionally;
    a coarse drive mechanism for moving said coarse-moving carriage two-dimensionally;
    a fine-moving table adapted to finely move two-dimensionally on said coarse-moving carriage;
    a mechanism for finely-movably holding said fine-moving table on said coarse-moving carriage with a gap therebetween, the gap being filled with a viscous fluid; and
    at least three linear-actuating means interposed between said coarse-moving carriage and said fine-moving table for finely driving said fine-moving table, each of said linear-actuating means being provided with at least one member which is rigid in the direction of the central axis thereof and flexible in a direction tilted with respect to the central axis thereof.

2. An apparatus according to claim 1, wherein two of said at least three linear actuating means are expansion means and are expanded and contracted in substantially the same direction and have the central axes thereof displaced from each other.

3. An apparatus according to claim 2, wherein said two expansion means include drive means for causing the expansion and contraction of the same amount in the same direction at the same time.

4. An apparatus according to claim 3, wherein said drive means further includes means for detecting yaw of said fine-moving table and means for expanding and contracting said two expansion means in opposite directions in a manner to correct said yaw.

5. An apparatus according to claim 3, wherein said two expansion means include drive means for causing yaw to said fine-moving table by applying expansion and contraction in opposite directions at the same time.

6. An apparatus according to claim 1, wherein said linear actuating means includes piezoelectric element actuators having an expansion characteristic of electrostrictive effect and means for applying a required voltage to said piezoelectric element actuators.

7. An apparatus according to claim 1, further comprising means for accurately measuring the amount of fine movement of said fine-moving table drive by said linear-actuating means, and a control circuit for driving said linear actuating means in such a manner that the amount of fine movement measured by said measuring means coincides with a predetermined target.

8. An apparatus according to claim 7, wherein said measuring means is a laser interferometric measurement system.

9. An apparatus according to claim 1, wherein said holding mechanism includes at least three elastic members for coupling said coarse-moving carriage and said fine-moving table.

10. An apparatus according to claim 9, wherein the surfaces opposed to each other of said coarse-moving carriage and said fine-moving table are parallel to each other.

11. An apparatus according to claim 2, wherein said two linear actuating means are arranged in parallel to each other in a relation spaced from each other by a definite distance in the direction perpendicular to the central axes thereof.

12. An apparatus according to claim 2, wherein the remaining one of said linear actuating means is arranged in a manner to expand and contract in the direction substantially perpendicular to the central axes of said two expansion means.

13. An apparatus according to claim 12, wherein said two expansion means include drive means for causing the expansion and contraction of the same amount in the same direction at the same time.

14. An apparatus according to claim 13, wherein said drive means further includes means for detecting yaw of said fine-moving table and means for expanding and contracting said two expansion means in opposite directions in a manner to correct said yaw.

15. An apparatus according to claim 12, wherein said two expansion means include drive means for causing yaw to said fine-moving table by applying expansion and contraction in opposite directions at the same time.

* * * * *